(12) United States Patent
Huo et al.

(10) Patent No.: US 9,054,521 B2
(45) Date of Patent: Jun. 9, 2015

(54) ELECTRO-STATIC-DISCHARGE (ESD) PROTECTION STRUCTURE WITH STACKED IMPLANT JUNCTION TRANSISTOR AND PARALLEL RESISTOR AND DIODE PATHS TO LOWER TRIGGER VOLTAGE AND RAISE HOLDING VOLATGE

(71) Applicant: Hong Kong Applied Science & Technology Research Institute Company Limited, Hong Kong (HK)

(72) Inventors: Xiao Huo, Hong Kong (HK); Beiping Yan, Hong Kong (HK); Xiaowu Cai, Shenzhen (CN)

(73) Assignee: Hong Kong Applied Science & Technology Research Institute Company, Ltd., Hong Kong (HK)

( * ) Notice: Subject to any disclaimer, the term of this patent is extended or adjusted under 35 U.S.C. 154(b) by 242 days.

(21) Appl. No.: 13/925,956

(22) Filed: Jun. 25, 2013

(65) Prior Publication Data

US 2014/0376135 A1    Dec. 25, 2014

(51) Int. Cl.
*H02H 9/00* (2006.01)
*H02H 9/04* (2006.01)
*H01L 27/02* (2006.01)

(52) U.S. Cl.
CPC ........... *H02H 9/046* (2013.01); *H01L 27/0248* (2013.01); *H01L 27/0259* (2013.01)

(58) Field of Classification Search
CPC .................................................. H01L 27/0266
USPC ............................................................. 361/56
See application file for complete search history.

(56) References Cited

U.S. PATENT DOCUMENTS

| | | | |
|---|---|---|---|
| 5,239,440 A | 8/1993 | Merrill | |
| 5,293,057 A * | 3/1994 | Ho et al. | 257/356 |
| 5,712,752 A * | 1/1998 | Kwon | 361/56 |
| 6,348,724 B1 * | 2/2002 | Koomen et al. | 257/577 |
| 6,560,081 B1 | 5/2003 | Vashchenko et al. | |
| 6,768,616 B2 | 7/2004 | Mergens et al. | |
| 7,057,867 B1 | 6/2006 | Vashchenko et al. | |
| 7,135,743 B2 | 11/2006 | Manna et al. | |
| 7,495,265 B2 | 2/2009 | Morishita | |
| 8,072,721 B2 | 12/2011 | Kwong et al. | |
| 8,369,054 B2 | 2/2013 | Cai et al. | |

\* cited by examiner

*Primary Examiner* — Stephen W Jackson
(74) *Attorney, Agent, or Firm* — Stuart T. Auvinen; gPatent LLC

(57) ABSTRACT

An electro-static-discharge (ESD) protection circuit has a vertical NPN transistor with a floating p-type base created by a deep p-type implant under an N+ source region. The deep p-type implant may be an ESD implant in a standard CMOS process. The p-type implant provides a low initial snap-back trigger voltage, but the holding voltage may be too low, creating latch-up problems. The holding voltage is raised by about one volt by connecting the emitter of the vertical NPN transistor to parallel resistor and diode paths. When the vertical NPN transistor is triggered, its current initially flows through the resistor, creating an increasing voltage drop through the resistor as current rises. Once the voltage across the resistor reaches 0.5 volt, the diode in parallel with the resistor becomes forward biased and shunts a higher current than the resistor, raising the holding voltage. A clamp transistor may replace the diode.

21 Claims, 6 Drawing Sheets

ELECTRO-STATIC-DISCHARGE (ESD) PROTECTION STRUCTURE WITH STACKED IMPLANT JUNCTION TRANSISTOR AND PARALLEL RESISTOR AND DIODE PATHS TO LOWER TRIGGER VOLTAGE AND RAISE HOLDING VOLATGE

FIELD OF THE INVENTION

This invention relates to electro-static-discharge (ESD) protection circuits, and more particularly to snap-back devices using a deep p-type implant under a drain region.

BACKGROUND OF THE INVENTION

Integrated circuits (IC's) are prone to damage and failure from an electro-static-discharge (ESD). ESD failures may occur in the factory and contribute to lower yields. Various ESD-protection structures have been placed near input, output, or bi-directional I/O pins of ICs. Many of these protection structures use passive components such as series resistors, diodes, and thick-oxide transistors. Other ESD structures use an active transistor to safely shunt ESD current.

As manufacturing ability improves and device sizes shrink, lower voltages are applied to transistors during normal operation. These smaller transistors are much more susceptible to over-voltage failure but can operate with a lower power-supply voltage, thus consuming less power and producing less heat.

Such smaller transistors are often placed in an internal "core" of an IC, while larger transistors with gate lengths that are above the minimum are placed around the core in the periphery. ESD-protection structures are placed in the periphery using these larger transistors.

Thinner gate oxides of the core transistors can be shorted, and substrate junctions melted by relatively small capacitivly-coupled currents applied to the tiny core devices. Static charges from a person or machinery can produce such damaging currents that are only partially blocked by the input-protection circuits in the periphery.

FIG. 1 shows a chip with several ESD-protection clamps. Low-voltage core circuitry 20 contains core transistors 22, 24, which have a small channel length and can be damaged by relatively low voltages. Low-voltage core circuitry 20 receives a power supply voltage VDD, such as 3 volts, 1.8 volts, 1.2 volts, or some other value. There may be thousands of core transistors in low-voltage core circuitry 20.

Protection from ESD pulses may be provided on each I/O pad, and by power clamp 16. Power clamp 16 is coupled between VDD and ground (VSS), and shunts current from an ESD pulse between the power rails.

Some cross-coupling may occur between different pads and low-voltage core circuitry 20, such as through substrates and capacitances. An ESD pulse applied to one I/O pad 30 may be coupled into low-voltage core circuitry 20 by this cross-coupling, causing damage to transistors 22, 24 in low-voltage core circuitry 20. Power clamp 16 may shunt enough current from the ESD pulse to reduce such cross-coupling to prevent damage. ESD pulses applied to I/O pins may still couple into low-voltage core circuitry 20, such as through power lines, but power clamp 16 may then be activated to reduce potential damage. Power clamp 16 may also turn on for other ESD pulses such as those applied to I/O pins, when the ESD pulse is shunted through a diode in the I/O pin's ESD-protection structure to the internal VDD rail, causing an indirect VDD-to-VSS ESD pulse. For example, an ESD pulse applied to I/O pad 30 may cause ESD protection device 32 to turn on to conduct to VDD.

Each I/O pad 30 may be outfitted with several ESD protection devices 32, 34, 36, 38 to protect against various possibilities. ESD protection device 38 turns on for a positive ESD pulse applied between I/O pad 30 and ground, while ESD protection device 36 turns on for a negative ESD pulse applied between I/O pad 30 and ground. Likewise, ESD protection device 32 turns on for a positive ESD pulse applied between I/O pad 30 and VDD, while ESD protection device 34 turns on for a negative ESD pulse applied between I/O pad 30 and VDD. Power clamp 16 may also turn on in some situations.

FIG. 2 is a graph of I-V characteristics of high-voltage transistors used in ESD protection devices and of low-voltage transistors used in low-voltage core circuitry 20. As a pulse such as an ESD pulse is applied to a low-voltage transistor such as is used in low-voltage core circuitry 20, the low-voltage transistor is turned off so the current is low as the voltage rises from the origin, as shown for curve 90.

Once the voltage is above the avalanche or punch-through breakdown voltage VTL, at current ITL, drain-to-source breakdown occurs (punch-through or avalanche breakdown of the parasitic NPN transistor in an n-channel transistor). The current then increases dramatically as the voltage is reduced (snaps back) as current flow continues to increase until the current reached the holding current IHL at the holding voltage, VHL. This holding voltage VHL must be above the power-supply voltage VDD to prevent latch-up.

As more current is applied to the transistor at the holding voltage, the current rises quickly until the second threshold voltage is reached, at a high current. Then thermal breakdown occurs as portions of the transistor may melt or otherwise be permanently damaged.

Curve 92 is similar in shape to curve 90, but has higher voltage thresholds for snap-back or avalanche breakdown, since curve 92 is for high-voltage transistors that are typically used in ESD protection devices. The high-voltage transistor reached snap-back threshold voltage VTH before the high-voltage transistors break down, but after low-voltage transistors in low-voltage core circuitry 20 break down, as shown by the LV-Core Breaks vertical line. Thus high-voltage transistors are not effective in protecting low-voltage transistors in low-voltage core circuitry 20.

A low snap-back trigger voltage is needed to protect the low-voltage transistors, but a high holding voltage is needed to prevent latch-up of the low-voltage transistors to the power supply. Thus there is a design window between VDD and the snap-back trigger voltage. This design window may be relatively small and difficult to achieve. As processes shrink, VDD and breakdown voltages are also reduced, reducing the design window.

Some prior-art ESD protection structures have large-area capacitors, resistors, or transistors which are undesirable. A special ESD implant step may be added to some complementary metal-oxide-semiconductor (CMOS) processes to fortify ESD structures. Unfortunately, breakdown voltages may still be less than trigger voltages, allowing damage to occur despite the ESD implant.

Leakage may be a problem for some structures, especially diode or diode-triggered structures. Leakage from p-n junctions is sometimes a problem with some ESD protection devices. Trigger voltages may be larger than breakdown voltages, allowing damage to occur before devices are triggered.

What is desired is an electro-static-discharge (ESD) protection circuit with a low snap-back trigger voltage and a high holding voltage. An ESD protection device featuring parallel paths to allow for better optimization is desirable. Using a resistor path to set the trigger voltage and a diode path to conduct a larger current and set the holding voltage is desired. A snap-back structure using an ESD implant under a drain is desired.

DETAILED DESCRIPTION

The present invention relates to an improvement in ESD protection circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors realize that an ESD implant may help to lower the trigger voltage, but the holding voltage may still be too low. The inventors realize that the holding voltage may be increased by adding a resistor path in parallel with a diode path. The resistor path sets the trigger voltage, while the diode path shunts a large current. The inventors increase the effective holding voltage to reduce the risk of latch up during normal operation. Leakage is also reduced.

Figure 3:
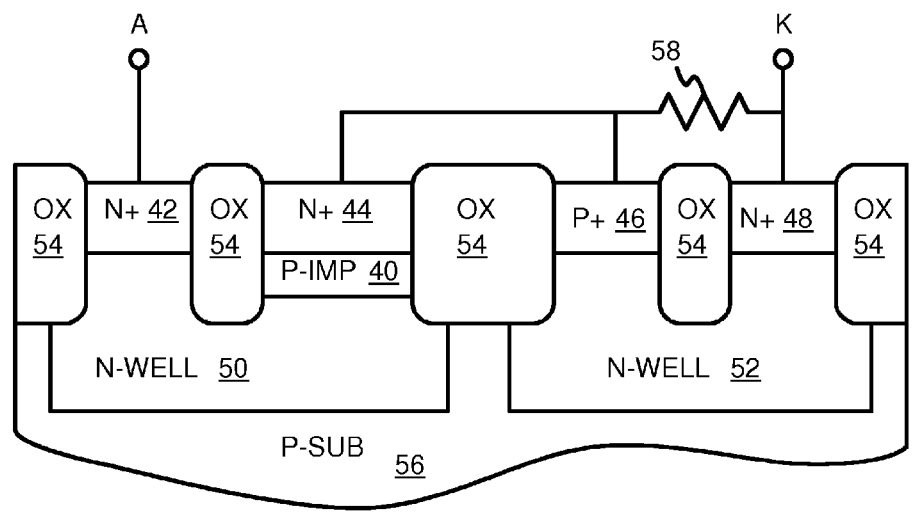
FIG. 3 is a cross-section of an ESD protection device with an ESD implant and parallel resistor and diode paths.

FIG. 3 is a cross-section of an ESD protection device with an ESD implant and parallel resistor and diode paths. N-wells 50, 52 are formed in p-substrate 56, and source/drain/tap regions are formed by openings in field oxide 54. N+ regions 42, 44 are formed in N-well 50 while N+ region 48 and P+ region 46 are formed in N-well 52.

An ESD implant is available in some advanced semiconductor processes. A lower effective doping or doping density is used for the ESD implant than the N+, P+ source/drain/tap implants. However, the implant energy is greater for the ESD implant so that deep p-implant region 40 is formed deeper in the substrate, under N+ region 44. The surface of the substrate above deep p-implant region 40 may be n-type.

Alternately, a faster-diffusing dopant may be used for deep p-implant region 40 than for N+ region 44 to generate the desired doping profile with deep p-implant region 40 under N+ region 44. Thus N+ region 44 does not directly contact N-well 50. Instead, N+ region 44, deep p-implant region 40, N-well 50, and tap N+ region 42 form a N-P-N structure. A standard ESD implant may be used to create deep p-implant region 40.

In one theoretical interpretation, N+ region 44 may act as an emitter, deep p-implant region 40 acts as a base, and N-well 50 acts as a collector of the vertical NPN transistor structure. Since deep p-implant region 40 is floating, conduction occurs by breakdown as deep p-implant region 40 is flooded with carriers from N+ region 44 or from N-well 50, or when the reverse-biased depletion region from N+ region 44 reaches across deep p-implant region 40 to touch N-well 50. Punch through or breakdown mechanisms may be involved.

Regardless of the exact physical mechanisms, deep p-implant region 40 produces a device with a smaller snap-back breakdown voltage than if deep p-implant region 40 were not present. However, the device in N-well 50 does not produce a holding voltage that is sufficiently low for some applications.

The holding voltage is raised by the parallel paths from N+ region 44. One path is through resistor 58 to node K. This resistor path is used to set the snap-back trigger voltage that was lowered by the vertical NPN structure in N-well 50. A second path is a diode path that is used to lower the holding voltage. The diode path in parallel with resistor 58 is a p-n diode from P+ region 46 to N-well 52, which is biased by tap N+ region 48 at node K.

Figure 4:
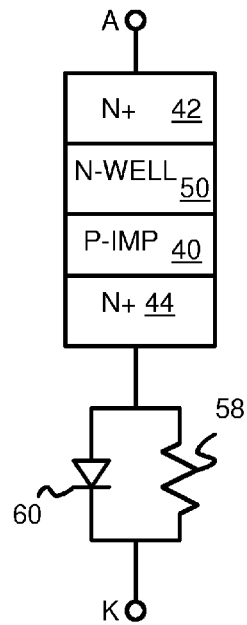
FIG. 4 is a diagram of the ESD structure of FIG. 3.

FIG. 4 is a diagram of the ESD structure of FIG. 3. An ESD pulse is applied across nodes A, K. Node A connects to the vertical NPN structure of tap N+ region 42, N-well 50, deep p-implant region 40, and N+ region 44. The path from N+ region 44 is split into two parallel paths. The resistor path allows current to flow through resistor 58 to node K even when the diode path is not yet conducting. The diode path can conduct a large current through diode 60 to node K.

Shortly after the snap-back trigger voltage is reached, diode 60 conducts a much larger current than resistor 58. However, near the snap-back trigger voltage, resistor 58 conducts more current than diode 60. Thus resistor 58 is more important than diode 60 for setting the trigger voltage. However, diode 60 can conduct a larger current than resistor 58, allowing for a higher holding voltage. Thus resistor 58 is important in setting the trigger voltage, while diode 60 is important in setting the holding voltage.

Figure 5:
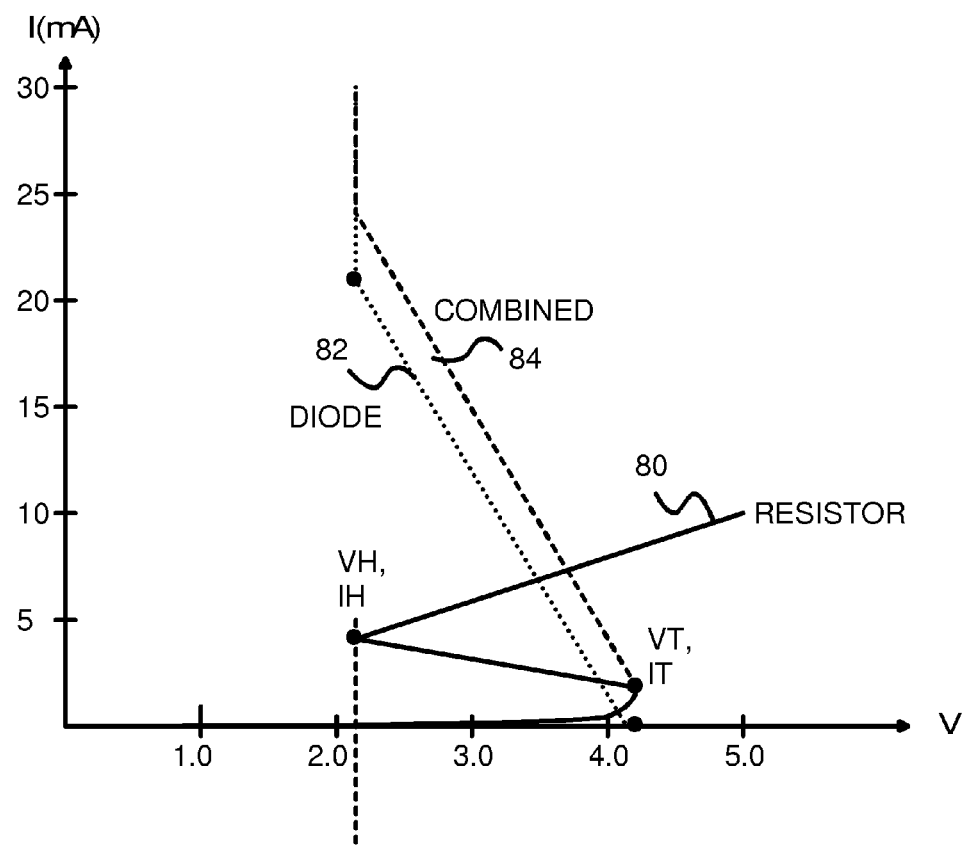
FIG. 5 is a graph showing parallel resistor and diode paths in the ESD protection device of FIGS. 3-4.

FIG. 5 is a graph showing parallel resistor and diode paths in the ESD protection device of FIGS. 3-4. Initially, very little current flows as the voltage across nodes A, K is raised from 0 volts to about 4 volts. Just above 4 volts, the vertical NPN structure with deep p-implant region 40 in N-well 50 is triggered, and current flows from node A to node K through resistor 58. Just after trigger voltage VT, as the current increases, the voltage drops as the voltage across the vertical NPN device in N-well 50 falls. However, the voltage across resistor 58 increases as the current increases.

The voltage across resistor 58 is also the voltage across diode 60. Initially diode 60 conducts a small but rising leakage current, but once the voltage across diode 60 reaches about 0.5 volts, the p-n junction turns on and increases its current exponentially. This occurs at the holding voltage VH. The exponential current increase through diode 60 (shown in curve 82) quickly surpasses the current through resistor 58 (shown in curve 80) and the voltage across resistor 58 is then controlled by diode 60. This causes the knee in curve 80 at the holding voltage.

FIG. 5 shows an enlargement near the trigger and holding voltages. The exponential shape of diode curve 82 is approximated by line segments in FIG. 5 due to this enlargement. Combined curve 84 is the sum of the diode current and the resistor current.

The trigger voltage VT is set by the NPN structure turning on, with its current being forced mostly through resistor 58. Once resistor 58 produces a voltage drop of about 0.5 volt, the p-n junction in diode 60 turns on, rapidly increasing the diode current, diode curve 82. This diode turn-on sets the holding voltage VH. The holding voltage would be lower if diode 60 were not present, since the combined current would not increase as rapidly with only the current through resistor 58.

Figure 6:
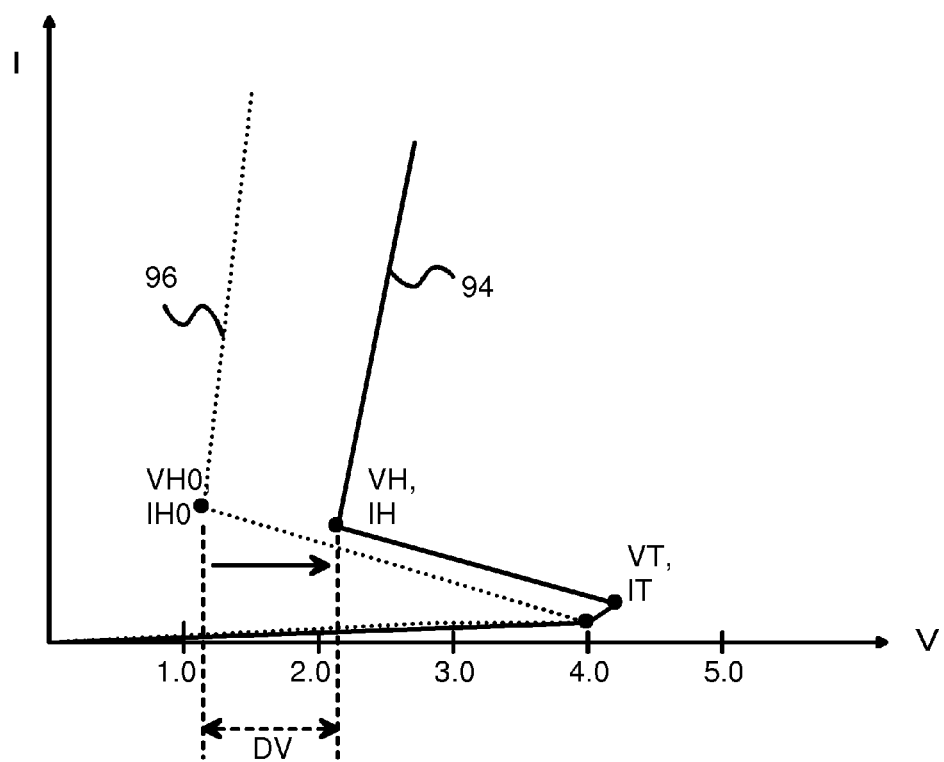
FIG. 6 is a graph highlighting an increased holding voltage while maintaining a low snap-back voltage for a dynamic-trigger ESD protection device.

FIG. 6 is a graph highlighting an increased holding voltage while maintaining a low snap-back voltage for a dynamic-trigger ESD protection device.

Curve 96 is an I-V curve for the NPN structure with deep p-implant region 40 in N-well 50, but without resistor 58 or diode 60. Initially, the full ESD voltage on VDD is applied, causing the voltage across deep p-implant region 40 to rise to its snap-back trigger voltage VT near 4 volts, causing deep p-implant region 40 to enter punch-through or avalanche breakdown mode. The voltage then falls as the current rises from trigger current IT at trigger voltage VT to holding current IH0 at holding voltage VH0. Current then increases dramatically while voltage rises slightly as the p-n junction in the NPN structure turns on.

Curve 94 is an I-V curve for the NPN structure with deep p-implant region 40 in N-well 50, with parallel paths for resistor 58 and diode 60. Initially, the full ESD voltage on VDD is applied, causing the voltage across deep p-implant region 40 to rise to its snap-back trigger voltage VT near 4 volts, causing deep p-implant region 40 to enter avalanche breakdown mode. The voltage then falls as the current rises from trigger current IT at trigger voltage VT to holding current IH at holding voltage VH. However, holding voltage VH is higher than VH0 since resistor 58 produces a voltage drop across diode 60 that eventually reaches the p-n forward bias voltage of about 0.5 volts, causing diode 60 to turn on and draw a much larger current. Thus curve 94 shoots up sooner than does curve 96. A higher holding voltage VH occurs with the parallel diode and resistor paths than the holding voltage VH0 produced by the NPN structure alone.

The holding voltage VH is increased by DV compared to VH0 without the parallel paths. Since the holding voltage VH is increased by voltage drop DV, latch-up is less likely to occur when a higher VDD is used. Thus the ESD protection device of FIGS. 3-4 provides a low initial snap-back voltage due to deep p-implant region 40 in the NPN structure, and a higher holding voltage due to the parallel resistor and diode paths. DV is about 1 volt when VT is about 4 volts and VH is about 2.4 volts for a 1.2-volt VDD circuit. Leakage may be less than a tenth of a nano-amp while protecting against a 2K-volt ESD pulse. The trigger voltage VT of about 4 volts is less than the transistor device breakdown voltage of about 5.9 volts.

Figure 7:
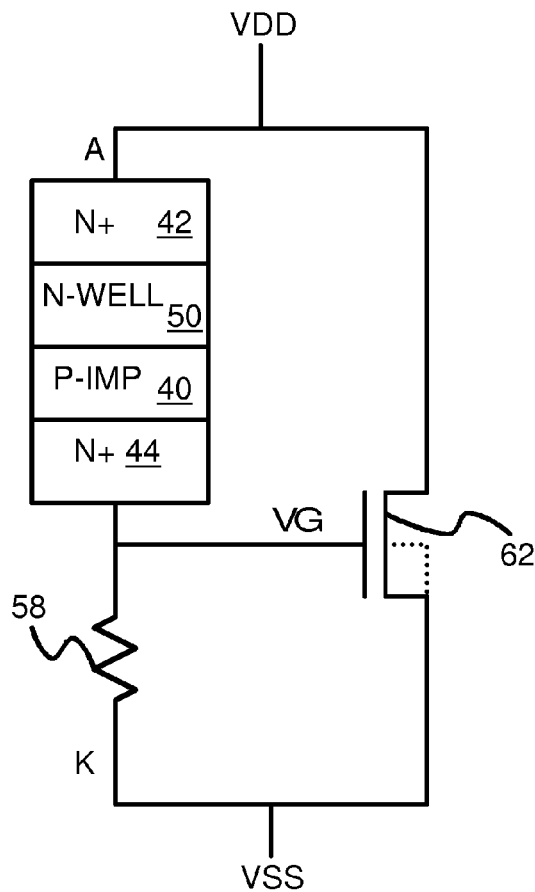
FIG. 7 is a diagram of an alternative of the ESD structure.

FIG. 7 is a diagram of an alternative of the ESD structure. The trigger voltage is lowered by deep p-implant region 40 in the NPN device of tap N+ region 42, deep p-implant region 40, N-well 50, N+ region 44 between nodes A and VG. Node A may be the same as VDD or may be different nodes, such as nodes coupled together by power clamp 16 during an ESD event.

Node VG is connected to node K (or VSS) by resistor 58. Clamp transistor 62 is a thin-oxide low-voltage n-channel transistor such as those used in low-voltage core circuitry 20. The gate VG of clamp transistor 62 is pulsed high by an ESD event, turning it on and shunting node A to node K (VDD to VSS for a power clamp). Clamp transistor 62 replaces diode 60 and acts to provide a parallel path to the resistor path.

During normal operation, resistor 58 keeps gate VG at ground, keeping clamp transistor 62 turned off. Clamp transistor 62 could also be a thick-oxide transistor. The bulk node of clamp transistor 62 is connected to its source, ground.

Figure 8:
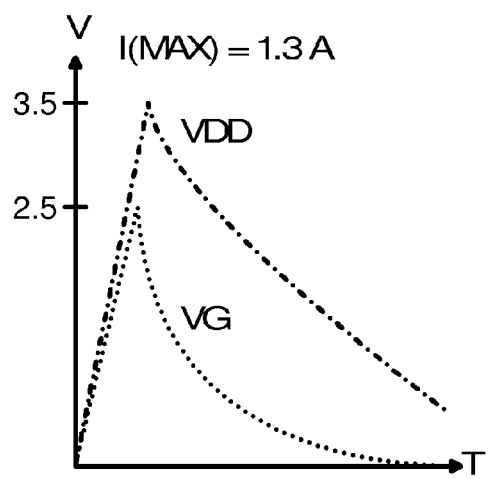
FIG. 8 is a graph of voltage waveforms of internal nodes for the ESD protection device of FIG. 7.

FIG. 8 is a graph of voltage waveforms of internal nodes for the ESD protection device of FIG. 7. When an ESD pulse is applied to VDD, the vertical NPN device is triggered at its trigger voltage and drives current through resistor 58. Once enough current passes through resistor 58 to produce an R-C voltage drop equal to the transistor threshold voltage of clamp transistor 62, clamp transistor 62 turns on and shunts current away from resistor 58 and the NPN device with deep p-implant region 40. VDD eventually is discharged lower until VG falls below the transistor threshold voltage of about 0.6 volt, and clamp transistor 62 turns off.

The value of resistor 58 may be small, such as 10 ohms, so that a large area is not required for a big resistor or for a big capacitor. Thus area and cost is reduced.

Alternate Embodiments

Several other embodiments are contemplated by the inventors. The alternatives of FIGS. 3, 4, 7 may be combined or used separately or in other combinations. While complementary metal-oxide-semiconductor (CMOS) transistors have been described, other kinds of transistors could be used, such as n-channel only, p-channel only, or various alternate transistor technologies such as Bipolar or BiCMOS.

Diodes may be implemented as n-channel, p-channel, or bipolar transistors, or junctions within these transistors. A capacitor could be attached to resistor 58 to provide an R-C time delay, or more complex circuits such as active triggering circuits may be added. In some embodiments, high-voltage transistors may be used rather than low-voltage transistors with appropriate bias conditions.

Different transistor, capacitor, resistor, and other device sizes can be used, and various layout arrangements can be used, such as multi-leg, ring, doughnut or irregular-shape transistors. Additional taps, guard rings, transistors, and other components may be added. The power node could be a common-discharge line (CDL) that normally floats rather than a power line. While a simple inverter of core transistors 22, 24 has been shown, more complex gates and interconnections may drive internal nodes, and there can be several internal nodes that connect to different input or output pads. The input/output pads may be connected to an input buffer, test-scan logic, and other circuits. More than one power supply may be used.

A p-channel transistor may be used rather than an n-channel transistor for clamp transistor 62, and the vertical NPN device of tap N+ region 42, N-well 50, deep p-implant region 40, and N+ region 44 may be replaced with a vertical or lateral PNP device, with reversed dopants and a deep n-implant region. A lateral NPN device could be used, and the shape of the vertical NPN device may differ, such as by having a more rounded bottom or filed-oxide boundaries.

Additional leaker devices such as resistors and small transistors could be added. Parasitic capacitances and resistances may be used from some components, depending on the process and device sizes used.

The ESD-protection circuit can be combined with other input-protection circuits, such as a power clamp circuit, other pad protection circuits, or a series-resistor protection circuit to the gate of an input buffer. Grounded-gate and thick oxide protection transistors and diodes can also be added at various points to increase ESD protection.

Figure 1:
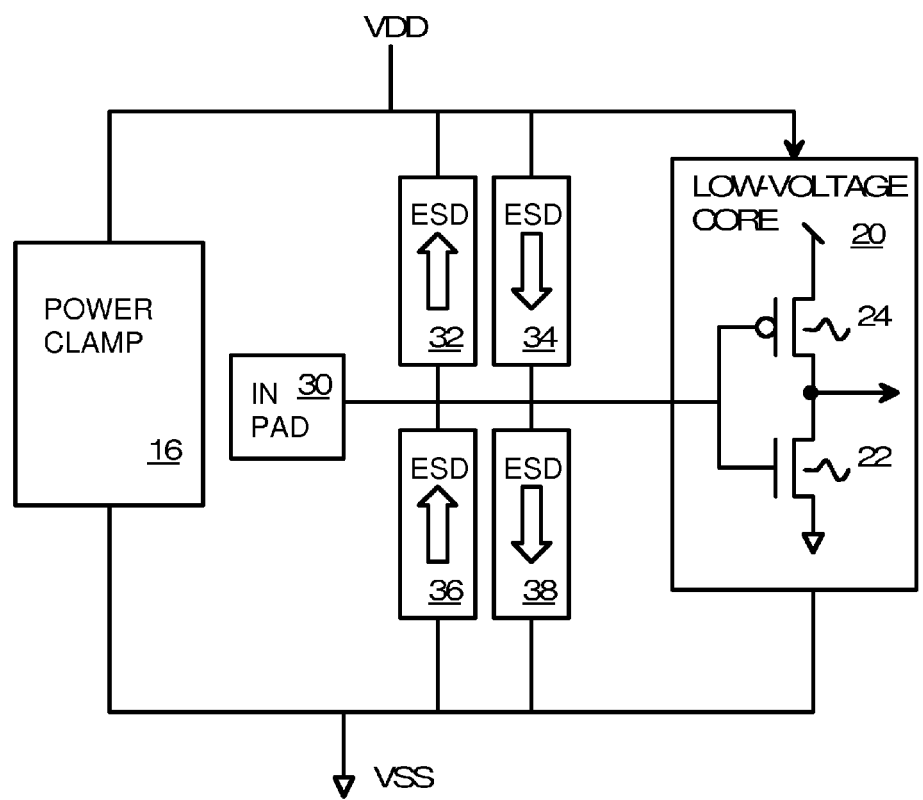
FIG. 1 shows a chip with several ESD-protection clamps.
Figure 2:
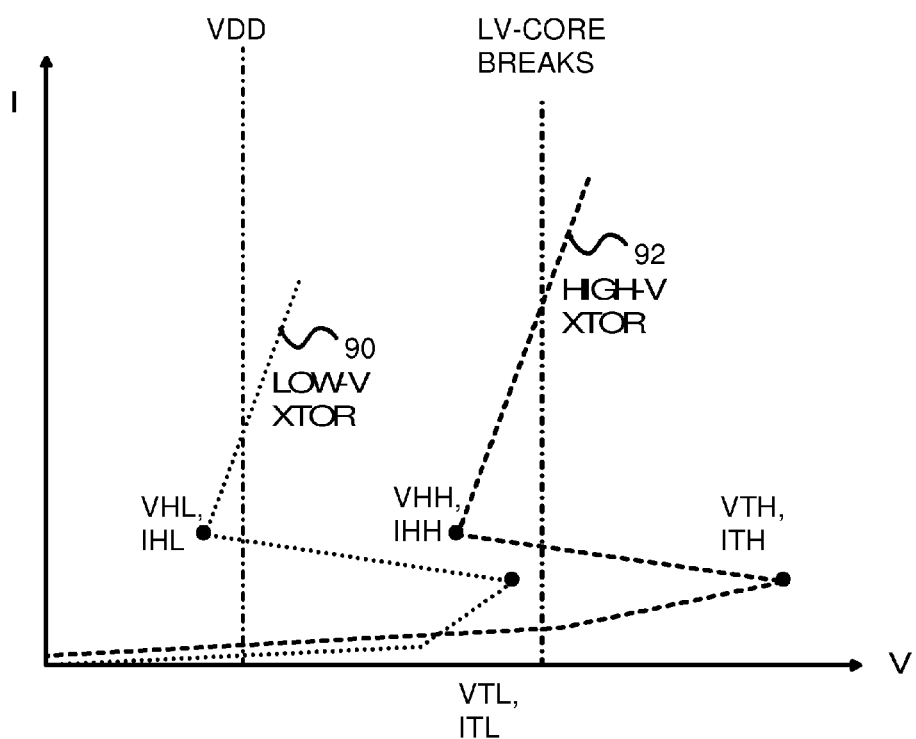
FIG. 2 is a graph of I-V characteristics of high-voltage transistors used in ESD protection devices and of low-voltage transistors used in low-voltage core circuitry.

Both thick oxide and thin oxide transistors may be protected by the power clamp and ESD protection devices. Alternately, several power clamps with different combinations of transistors and power-supply voltages may be used. Each pad may have only one ESD protection device, only two ESD protection devices, or all four ESD protection devices as shown in FIG. 1. The anode and cathode (A and K) nodes may be reversed to swap the direction of protection.

Bias, VDD, and voltage values may vary somewhat due to process, temperature, and design variances. For example, the forward bias voltage may be 0.5 volt, +/−0.1 volt, the trigger voltage may be 4 volts, +/−0.5 volts, and the holding voltage may be 2 volts +/−0.5 volts. Other values are possible.

The snap-back breakdown voltage of clamp transistor 62 may vary somewhat from low-voltage transistors in low-voltage core circuitry 20. For example, clamp transistor 62 may have a slightly longer channel length or other features to harden it, while low-voltage transistors in low-voltage core circuitry 20 may use minimum channel lengths and dimensions. Snap-back voltages may vary with process, temperature, and exact geometries of the transistors. While descriptions of operation have been given based on a theoretical understanding of the physical processes, these theoretical descriptions may be incorrect. Second and third order effects may also be present. Various mechanisms may be responsible for breakdown and conduction under various conditions.

Large output driver transistors also act as large diodes for some ESD tests and conditions. For example, when the ESD pulse is applied across an I/O pad and the power-supply pad, a positive ESD pulse can turn on a parasitic p-n drain-substrate junction of the drain of the large p-channel driver transistor. The n-type substrate or well of the p-channel driver transistor is normally connected to the I/O power supply. Thus the p-n junction is forward biased by the positive ESD pulse. While output pads have been described, other connection technologies may be substituted, such as ball-grid-array (BGA), flip-chip, etc., and the term pads is considered to apply to all such balls, pads, landings, etc. that are for external connection.

Likewise, when the ESD pulse is applied across the I/O pad and the ground pad, a negative ESD pulse can turn on the parasitic n-p drain-substrate junction of the drain of the large n-channel driver transistor. The p-type substrate or well of the n-channel driver transistor is normally connected to the I/O ground. Thus the p-n junction is forward biased by the negative ESD pulse. Various cross-domain coupling paths and mechanisms may exist that couple ESD pulses applied to one power-supply domain to another power-supply domain.

The background of the invention section contains background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An electro-static-discharge (ESD) protection circuit comprising:
    a first terminal and a second terminal that an ESD pulse is applied across during an ESD event;
    an NPN transistor having a floating base formed by a p-implant region, the NPN transistor having a collector connected to the first terminal that receives the ESD pulse, and an emitter connected to a first node;
    a resistor connected between the first node and the second terminal; and
    a diode connected between the first node and the second terminal;
    wherein the diode becomes forward biased when current from the NPN transistor flows through the resistor to create a voltage drop across the resistor that reaches a p-n junction forward bias voltage for the diode.

2. The ESD protection circuit of claim 1 wherein the p-implant region is a deep p-implant region that is beneath a surface of a substrate, wherein a surface of the substrate directly above the deep p-implant region is not a p-type region.

3. The ESD protection circuit of claim 2 wherein the emitter of the NPN transistor comprises a N+ region above the p-implant region;
    wherein the collector of the NPN transistor comprises an N-well under the p-implant region,
    wherein the NPN transistor comprises a vertical NPN transistor.

4. The ESD protection circuit of claim 3 wherein a doping density of the p-implant region is less than a doping density of the N+ region.

5. The ESD protection circuit of claim 3 wherein the diode comprises a P+ region formed in a second N-well, and a N+ tap formed in the second N-well;
    wherein the P+ region is connected to the first node;
    wherein the N+ tap is connected to the second terminal.

6. The ESD protection circuit of claim 5 further comprising:
    a transistor N+ tap formed in the N-well of the NPN transistor;
    wherein the first terminal is connected to the N+ tap in the N-well.

7. The ESD protection circuit of claim 3 wherein the NPN transistor begins conducting a trigger current at a trigger voltage that causes punch-through or avalanche breakdown of the floating base;
    wherein the trigger current flows through the resistor and less than 10% of the trigger current flows through the diode, whereby the trigger current flows mainly through the resistor.

8. The ESD protection circuit of claim 7 wherein after the trigger voltage is reached, the trigger current increases until a voltage drop across the resistor reaches a forward-bias voltage, causing the diode to conduct a forward-biased current;
wherein a holding voltage occurs when the diode begins to conduct the forward-biased current.

9. The ESD protection circuit of claim 8 wherein the forward-bias voltage is 0.5 volt, +/−0.1 volt, the trigger voltage is 4 volts, +/−0.5 volts, and the holding voltage is 2 volts +/−0.5 volts.

10. The ESD protection circuit of claim 9 wherein a power-supply voltage is less than the holding voltage.

11. An electro-static-discharge (ESD) protection device comprising:
an NPN transistor having a floating base between a first N region connected to a first terminal, and a second N region connected to a gate node;
a resistor connected between the gate node and a second terminal; and
a clamp transistor having a gate connected to the gate node, the gate controlling a channel between the first terminal and the second terminal.

12. The ESD protection device of claim 11 wherein the floating base is unconnected to any node or voltage, the floating base only connected to the first N region and to the second N region.

13. The ESD protection device of claim 12 wherein an ESD pulse is applied across the first terminal and the second terminal.

14. The ESD protection device of claim 13 wherein the second N region comprises an N+ source/drain/tap region formed on a surface of a substrate;
wherein the first N region comprises an N-well having an N+ source/drain/tap region formed on a surface of a substrate and connected to the first terminal;
wherein the floating base comprises a deep p-implant region formed under the second N region,
wherein the NPN transistor is a vertical NPN transistor.

15. The ESD protection device of claim 14 wherein the clamp transistor comprises an n-channel transistor.

16. The ESD protection device of claim 15 wherein the second terminal is a ground and the first terminal is connected to an I/O pad.

17. The ESD protection device of claim 15 wherein the second terminal is a ground and the first terminal is a power supply,
wherein the ESD protection device is a power clamp.

18. An input protection device comprising:
an input pad that is able to receive an electro-static-discharge (ESD) pulse;
a ground line that is connected to a ground during normal operation;
a first ESD circuit having a first terminal connected to the input pad and a second terminal connected to the ground line, for shunting a positive ESD pulse to the ground line;
a second ESD circuit having a first terminal connected to the ground line and a second terminal connected to the input pad, for shunting a negative ESD pulse to the ground line;
wherein each ESD circuit comprises:
a first terminal and a second terminal that an ESD pulse is applied across during an ESD event;
an NPN transistor having a floating base formed by a p-implant region, the NPN transistor having a collector connected to the first terminal that receives the ESD pulse, and an emitter connected to a first node;
a resistor connected between the first node and the second terminal; and
a diode connected between the first node and the second terminal.

19. The input protection device of claim 18 wherein the diode becomes forward biased when current from the NPN transistor flows through the resistor to create a voltage drop across the resistor that reaches a p-n junction forward bias voltage for the diode;
wherein the p-implant region is a deep p-implant region that is beneath a surface of a substrate, wherein a surface of the substrate directly above the deep p-implant region is not a p-type region.

20. The input protection device of claim 19 further comprising:
a power supply line that receives a power supply voltage during normal operation;
a third ESD circuit having a first terminal connected to the power supply line and a second terminal connected to the input pad, for shunting a negative ESD pulse to the power supply line; and
a fourth ESD circuit having a first terminal connected to the input pad and a second terminal connected to the power supply line, for shunting a positive ESD pulse to the power supply line.

21. The input protection device of claim 20 further comprising:
a first power-supply clamp ESD circuit having a first terminal connected to the power supply line and a second terminal connected to the ground line, for shunting an ESD pulse from the power supply line to the ground line.

* * * * *